United States Patent
Liu

(10) Patent No.: US 12,392,815 B1
(45) Date of Patent: Aug. 19, 2025

(54) ELECTRONIC DEVICE AGING TEST APPARATUS

(71) Applicant: HAITUO INSTRUMENT (JIANGSU) CO., LTD., Suzhou (CN)

(72) Inventor: Dongxi Liu, Suzhou (CN)

(73) Assignee: HAITUO INSTRUMENT (JIANGSU) CO., LTD., Suzhou (CN)

( * ) Notice: Subject to any disclaimer, the term of this patent is extended or adjusted under 35 U.S.C. 154(b) by 0 days.

(21) Appl. No.: 19/201,619

(22) Filed: May 7, 2025

Related U.S. Application Data

(63) Continuation of application No. PCT/CN2023/095288, filed on May 19, 2023.

(30) Foreign Application Priority Data

Nov. 17, 2022 (CN) .......................... 202211462361.9

(51) Int. Cl.
*G01R 31/26* (2020.01)
*G01R 1/04* (2006.01)
*G01R 31/28* (2006.01)

(52) U.S. Cl.
CPC ..... *G01R 31/2642* (2013.01); *G01R 31/2874* (2013.01); *G01R 31/2875* (2013.01); *G01R 31/2877* (2013.01); *G01R 31/2886* (2013.01); *G01R 31/2891* (2013.01); *G01R 1/0458* (2013.01); *G01R 31/2862* (2013.01); *G01R 31/2863* (2013.01)

(58) Field of Classification Search
CPC ............ G01R 31/2874; G01R 31/2891; G01R 31/2886; G01R 31/2875; G01R 31/2877; G01R 31/2863; G01R 1/0458; G01R 31/2862

USPC ...................................................... 324/750.08
See application file for complete search history.

(56) References Cited

U.S. PATENT DOCUMENTS

| | | | |
|---|---|---|---|
| 2005/0178219 A1* | 8/2005 | Grossman ............ | G01N 17/002 236/44 C |
| 2011/0079071 A1* | 4/2011 | Schultz ................ | G01N 17/004 73/1.01 |
| 2021/0199315 A1* | 7/2021 | Chen ...................... | F24F 1/022 |
| 2021/0262720 A1* | 8/2021 | Cheng .................... | F25D 17/08 |

(Continued)

FOREIGN PATENT DOCUMENTS

| CN | 202221418 U | 5/2012 |
|---|---|---|
| CN | 204007664 U | 12/2014 |
| CN | 206057499 U | 3/2017 |

(Continued)

*Primary Examiner* — Raul J Rios Russo
(74) *Attorney, Agent, or Firm* — SZDC Law PC

(57) ABSTRACT

The invention provides an electronic device aging test apparatus, including a box body, a test chamber provided in the box body and provided with an air inlet and an air return inlet, a circulating air duct provided on a periphery of the test chamber and in fluid communication with the air inlet and the air return inlet, and a circulating fan. A fresh air port and an air outlet are provided on a wall of the circulating air duct. The air outlet is provided downstream of the air return inlet, and the fresh air port is provided upstream of the circulating fan. The fresh air port is located between the air outlet and the circulating fan, and a baffle device is provided between the fresh air port and the air outlet. The baffle device has at least two working states.

8 Claims, 5 Drawing Sheets

(56) References Cited

U.S. PATENT DOCUMENTS

2022/0136768 A1\* 5/2022 Maendel ................ F23B 7/002
                                                                                         34/565

FOREIGN PATENT DOCUMENTS

| CN | 110586205 A | 12/2019 |
|----|-------------|---------|
| CN | 112393354 A | 2/2021 |
| CN | 113406423 A | 9/2021 |
| CN | 114184940 A | 3/2022 |
| CN | 114526935 A | 5/2022 |
| CN | 217085109 U | 7/2022 |
| CN | 217819299 U | 11/2022 |
| CN | 115508660 A | 12/2022 |
| JP | 2008267818 A | 11/2008 |
| JP | 2009300122 A | 12/2009 |

\* cited by examiner

ELECTRONIC DEVICE AGING TEST APPARATUS

This application is a Continuation Application of PCT/CN2023/095288, filed on May 19, 2023, which claims priority to Chinese Patent Application No. CN 202211462361.9, filed on Nov. 17, 2022, which is incorporated by reference for all purposes as if fully set forth herein.

FIELD OF THE INVENTION

The present invention relates to an electronic device aging test apparatus, applicable to the technical field of electronic device aging test.

DESCRIPTION OF THE RELATED ART

With the booming development of 5G communications, semiconductor chips, aerospace technology, and other high-precision and cutting-edge technology industries, the importance of precision electronic components widely used in such industries is also becoming increasingly apparent. To control the quality of various types of electronic device products, the products usually need to undergo aging tests before leaving the factory. At present, in a conventional aging test, a product is usually placed in a high-temperature environment, a voltage load is applied to the product, and the activation of failure mechanisms of the product is accelerated via high temperature to determine the reliability of the product. However, after loads are applied to electronic devices, the electronic devices dissipates heat. Semiconductor chips or other products with high heat generation, in particular, can usually reach heat generation of around 10 kW. After heat dissipated by a product accumulates around the product, a large error exists between an actual ambient temperature of the product and a required test temperature, and ambient temperatures of multiple products are also different, resulting in lower accuracy of test results.

In existing electronic device aging test apparatuses, a fresh air port and an air outlet that are communicated with the outside are usually provided in a test chamber. In some test apparatuses, external blower or exhaust fan devices are further connected to the fresh air port or the air outlet, and the external devices disperse heat that accumulates in the test chamber to achieve heat dissipation and cooling. However, in such solutions, regardless of whether fresh air directly enters the test chamber or is directly discharged from the test chamber, there tend to be good heat dissipation for products close to a fresh air port or an air outlet in the chamber but poor heat dissipation for products at other positions, and the problem of large temperature differences between products cannot be solved. In addition, although forced exhaust using external devices can achieve quick cooling, temperature differences between products are further increased, and temperatures inside the chamber are more nonuniform, making it impossible to ensure the accuracy of test results.

In addition to the foregoing cases, in some test apparatuses, a fresh air port and an air outlet are provided in a circulating air duct. However, if external devices are not used to assist in heat dissipation in such methods, airflows inside a box body cannot be smoothly discharged from the box body, leading to poor heat dissipation. If external devices are added, airflows inside the box body are turbulent, which impairs a stable test environment. Further, in the foregoing cases, when external devices are used to assist in heat dissipation, energy consumption is increased, causing increasing test costs.

SUMMARY OF THE INVENTION

To resolve the foregoing defects in the prior art, the present invention provides an electronic device aging test apparatus.

The technical solution adopted in the present invention is an electronic device aging test apparatus including a box body, a test chamber provided in the box body and provided with at least one set of an air inlet and an air return inlet, a test circuit unit provided in the test chamber and configured to connect to an electronic device under test, an electric cabinet adjacent to the test chamber and connected to the test circuit unit to supply power, a circulating air duct provided on a periphery of the test chamber and having two ends respectively communicated with the air inlet and the air return inlet, a circulating fan provided in the circulating air duct, and a heating device provided in the circulating air duct. The circulating fan drives an airflow to start from the circulating air duct, sequentially pass through the air inlet, the test chamber, and the air return inlet, and return to the circulating air duct, to achieve airflow circulation in the box body, so that circulating air carrying heat can make the environment in the test chamber meet test requirements, and the circulating air can dissipate heat for a product, thereby preventing thermal accumulation around the product, and also ensuring uniform test temperatures at different positions in the box body. A fresh air port for external air to enter the circulating air duct and an air outlet for air in the circulating air duct to be discharged outside are opened in a wall of the circulating air duct. The air outlet is provided downstream of the air return inlet in an airflow direction, the fresh air port is provided upstream of the circulating fan in the airflow direction, and an arrangement position of the fresh air port is between the air outlet and the circulating fan. Specifically, the arrangement position is a relative position in the airflow direction when a baffle device is in a first working state (which is described below), and does not specifically indicate a relative position in structure. The baffle device configured to open or shield the fresh air port and the air outlet and configured to open or block the circulating air duct located between the air outlet and the fresh air port is provided between the fresh air port and the air outlet.

The baffle device has at least two working states. When the baffle device is in the first working state, the fresh air port and the air outlet are shielded, and the circulating air duct is opened. In this case, the test apparatus is in a normal test process, and the circulating fan drives an airflow in the box to circulate in the test chamber and the circulating air duct, thereby ensuring a uniform test temperature in the box. When the baffle device is in a second working state, the fresh air port and the air outlet are opened, and the circulating air duct is shielded. In this case, the test apparatus is in a heat dissipation process. Because the circulating air duct between the fresh air port and the air outlet is blocked and the fresh air port is provided upstream of the circulating fan, external fresh air is driven by the circulating fan to enter the circulating air duct through the fresh air port, enters the test chamber from the circulating air duct through the air inlet, and enters the circulating air duct again through the air return inlet corresponding to the air inlet, thereby ensuring that the fresh air can uniformly take away heat that accumulates around a product in the test chamber. The airflow that enters the circulating air duct again flows to the air outlet along the circulating air duct. Because the circulating air duct between the fresh air port and the air outlet is blocked, instead of continuing to circulate, air is discharged from the box body through the air outlet. In the present invention, the air outlet, the baffle device, and the fresh air port are sequentially provided between the air return inlet of the test chamber and the circulating fan, and working states are switched via the baffle device, so that when the aging test apparatus performs a normal test, circulating air can normally circulate, thereby ensuring a uniform temperature in the test chamber. During heat dissipation, external fresh air may be sucked by the circulating fan to smoothly enter the circulating air duct, dissipates heat along an existing flow path of circulating air in the box body, and can be smoothly discharged outside, so that heat in the box body can be quickly taken away, and it is ensured that temperatures of different products are uniform and consistent, thereby improving the accuracy of test results. In addition, the existing circulating fan of the test apparatus is used to drive fresh air, so that the existing flow path of circulating air in the box is kept from being disturbed by an external device, to ensure smooth air intake and discharge of the fresh air port and the air outlet, thereby improving heat dissipation, and further ensure a stable test environment in the box and also reduces energy consumption, thereby reducing test costs.

Preferably, the baffle device has at least one third working state between the first working state and the second working state. When the baffle device is in the third working state, the fresh air port and the air outlet are partially shielded, and the circulating air duct is partially opened. In this case, the test apparatus is in an adjustable heat dissipation state. Because the fresh air port is partially shielded, a small amount of external fresh air is sucked into the circulating air duct by the circulating fan. In this case, the circulating air duct is partially opened, a part of an airflow that has been circulating in the box body continues to circulate. After flowing into the circulating air duct, the external fresh air is mixed with the existing circulating air in the circulating air duct, and is driven by the circulating fan to enter the test chamber to dissipate heat for an electronic device. Because the air outlet is also partially shielded, an airflow that enters the circulating air duct again from the test chamber is split when flowing to the air outlet. One part is discharged from the box body through the air outlet to complete heat dissipation, and the other part flows through an opening made by the baffle device, and is mixed with fresh air that enters subsequently to circulate again. When the baffle device is adjusted, the opening degree of the fresh air port and the opening degree of the air outlet are synchronized and identical, i.e., simultaneously increase or simultaneously decrease. The opening degree of the circulating air duct is synchronized but opposite to the former two, i.e., when the opening degrees of the fresh air port and the air outlet increase, the opening degree of the circulating air duct decreases accordingly, and when the opening degrees of the fresh air port and the air outlet decrease, the opening degree of the circulating air duct increases accordingly. The opening degrees of the fresh air port, the air outlet, and the circulating air duct are adjusted via the baffle device, so that air volumes of air intake and air discharge and a flow splitting ratio of an airflow at the air outlet can be adjusted, making it convenient to flexibly adjust air discharge strength based on actual heat generation of a product under test, thereby improving the use flexibility and universality of the test apparatus.

More preferably, the baffle device includes a rotating shaft rotatably connected to an inner wall of the circulating air duct in an airflow direction perpendicular to an arrangement position of the baffle device, a first baffle fixedly connected to one side of the rotating shaft and configured to open or shield the fresh air port, a second baffle fixedly connected to the other side of the rotating shaft and configured to open or block the circulating air duct, a third baffle fixedly provided on a lateral side of the second baffle that is close to the inner wall of the circulating air duct, perpendicular to the second baffle, and configured to open or shield the air outlet, and a driving assembly connected to the rotating shaft and configured to drive the rotating shaft to rotate. When the baffle device is in the first working state, the first baffle fully shields the fresh air port, the second baffle fully opens the circulating air duct, and the third baffle fully shields the air outlet. When the baffle device is in the third working state, the first baffle partially shields the fresh air port, the second baffle partially blocks the circulating air duct, and the third baffle partially shields the air outlet. When the baffle device is in the second working state, the first baffle fully opens the fresh air port, the second baffle fully blocks the circulating air duct, and the third baffle fully opens the air outlet. The linkage adjustment of the opening degrees of the fresh air port, the air outlet, and the circulating air duct can be simply and conveniently achieved via the foregoing structure, so that the structure of the test apparatus is simplified, and the production costs of the test apparatus are also reduced. It should be noted that although the terms "fully shield" and "fully open" are used here, they cannot be limited to the theoretical "fully" due to errors in manufacturing, processing, installation, etc. That is, "fully shield" should not be limited to "airtight", but should be interpreted as "basically airtight", and "fully open" should not be limited to "zero obstruction to an airflow", but should be interpreted as "basically zero obstruction to an airflow".

More preferably, the air outlet is provided on a sidewall of the circulating air duct that is perpendicular to the rotating shaft, and the fresh air port is provided on a sidewall of the circulating air duct that is parallel to the rotating shaft, making it convenient to precisely adjust the opening degrees of the fresh air port and the air outlet via the first baffle and the third baffle, especially the air outlet, because the proper control of air discharge is significant to heat dissipation.

More preferably, the driving assembly includes a rocker arm with one end fixedly connected to an end portion of the rotating shaft and an actuating member slidably connected to the box body, a sliding groove perpendicular to an axial direction of the rotating shaft is opened at an end portion of the actuating member close to the rocker arm, a slider is provided at the other end of the rocker arm, and the slider is connected in the sliding groove in both a relatively rotatable manner and a relatively slidable manner, so that the rotation angles of the first baffle, the second baffle, and the third baffle can be simply and conveniently adjusted by sliding the actuating member.

Preferably, the test circuit unit includes a plurality of carrier boards arranged vertically and configured to load electronic devices, the plurality of carrier boards divide the test chamber into a plurality of test layers, and one set of the air inlet and the air return inlet are provided on each of the test layers, so that it can be ensured that fresh air passes around every product while improving the test efficiency.

More preferably, the air inlet and the air return inlet in each test layer are respectively provided on two opposite sidewalls of the test layer, thereby ensuring that the flow direction of fresh air is stable, and preventing nonuniform heat dissipation due to turbulence.

More preferably, a flow deflector corresponding to the air inlet in both quantity and position and configured to guide an airflow to the corresponding air inlet is provided on an inner wall in the circulating air duct that is opposite to the air inlet, each flow deflector is provided inclined from upstream to downstream of the airflow direction from a side of the flow deflector that is connected to the inner wall of the circulating air duct to a side close to the air inlet, so that fresh air can be fed into every test layer.

More preferably, a length of each flow deflector located downstream of the airflow direction is greater than a length of the flow deflector located upstream of the airflow direction, to ensure the same air volume for each test layer, thereby further ensuring uniform heat dissipation in the box body.

Preferably, the heating device is located between the fresh air port and the circulating fan, making it convenient to heat fresh air to some extent according to a test requirement to adjust the temperature of the fresh air.

Due to the use of the foregoing technical solutions, the present invention has the following advantages over the related art.

The electronic device aging test apparatus of the present invention my cut off existing circulating air in the box body and enables external fresh air to dissipate heat along the flow path of the existing circulating air, so that heat in the box body can be quickly taken away, and it is ensured that temperatures of different products are uniform and consistent, thereby improving the accuracy of test results. In addition, the existing circulating fan of the test apparatus is used to drive fresh air, so that the existing flow path of circulating air in the box body is kept from being disturbed by an external device, to ensure smooth air intake and discharge of the fresh air port and the air outlet, thereby improving heat dissipation, and further ensure a stable test environment in the box and also reduces energy consumption, thereby reducing test costs.

BRIEF DESCRIPTION OF THE DRAWINGS

Some specific embodiments of the present invention are described below in detail in an exemplary rather than limiting manner with reference to the accompanying drawings. Identical reference numerals in the accompanying drawings label the same or similar components or parts. It should be understood by those skilled in the art that these accompanying drawings are not necessarily drawn to scale. In the accompanying drawings.

Figure 1:
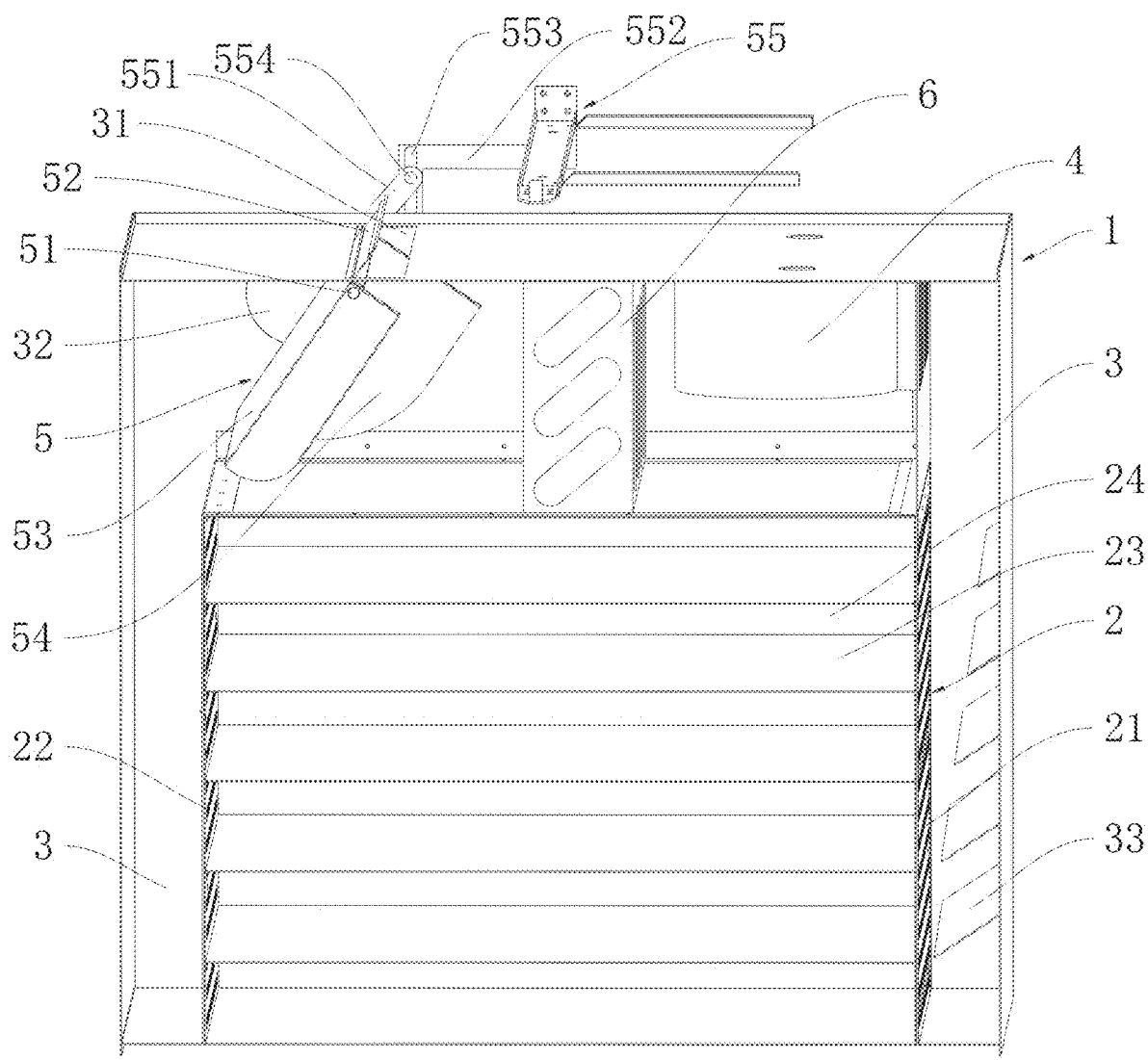
FIG. 1 is a schematic structural diagram according to an embodiment of the present invention.
Figure 2:
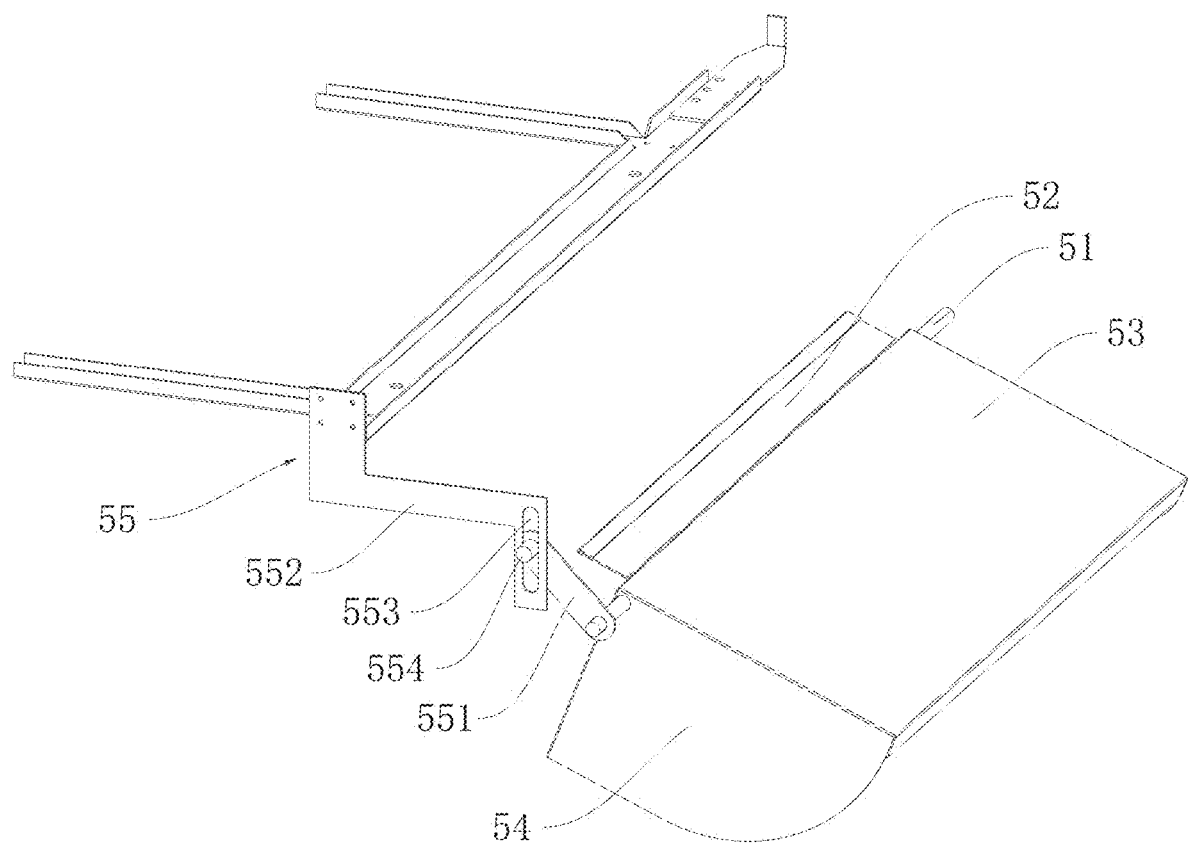
FIG. 2 is a schematic structural diagram of a baffle device in the embodiment shown in FIG. 1.

REFERENCE NUMERALS 1. box body; 2. test chamber; 21. air inlet; 22. air return inlet; 23. carrier board; 24. test layer; 3. circulating air duct; 31. fresh air port; 32. air outlet; 33. flow deflector; 4. circulating fan; 5. baffle device; 51. rotating shaft; 52. first baffle; 53. second baffle; 54. third baffle; 55. driving assembly; 551. rocker arm; 552. actuating member; 553. sliding groove; 554. slider; and 6. heating device.

DETAILED DESCRIPTION OF THE PREFERRED EMBODIMENTS

The following clearly and completely describes the technical solutions in the present invention with reference to the accompanying drawings. Apparently, the embodiments described below are some embodiments of the present invention rather than all the embodiments. All other embodiments obtained by persons of ordinary skill in the art based on the embodiments of the present invention without creative efforts fall within the protection scope of the present invention.

In the description of the present invention, it needs to be noted that the terms "first", "second", and "third" are used only for description, but are not intended to indicate or imply relative importance. In addition, the technical features involved in different embodiments of the present invention described below can be combined with each other as long as they do not constitute a conflict between them.

Figure 3:
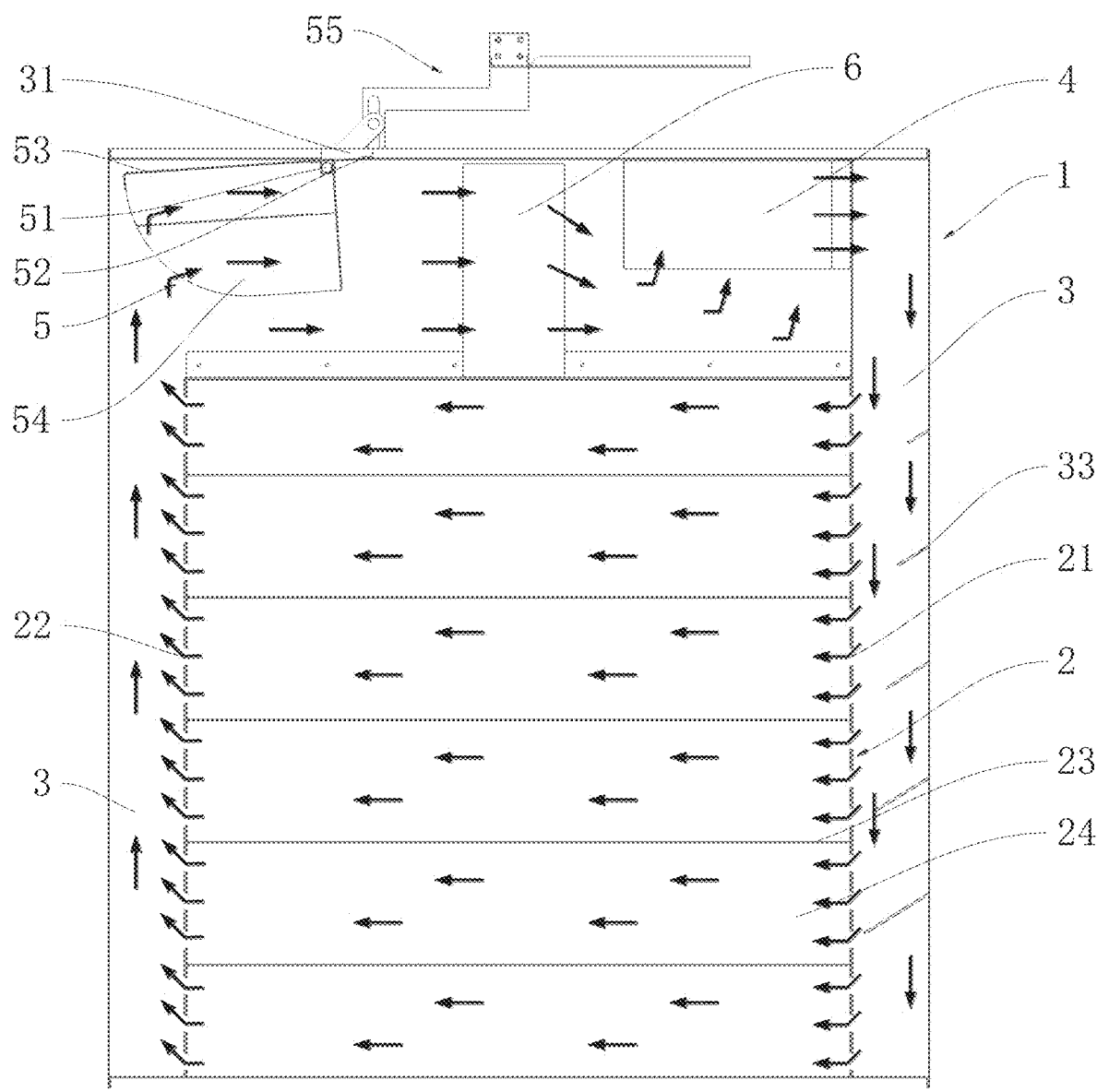
FIG. 3 is an airflow diagram when a baffle device is in a first working state in the embodiment shown in FIG. 1.

Referring to FIG. 1 to FIG. 5, this embodiment provides an electronic device aging test apparatus, including a box body 1, a test chamber 2 provided in the box body 1 and provided with at least one set of an air inlet 21 and an air return inlet 22, a test circuit unit (not shown in the figure) provided in the test chamber 2 and configured to connect to an electronic device under test, an electric cabinet (not shown in the figure) adjacent to the test chamber 2 and connected to the test circuit unit to supply power, a circulating air duct 3 provided on a periphery of the test chamber 2 and having two ends in fluid communication with the air inlet 21 and the air return inlet 22 respectively, a circulating fan 4 provided in the circulating air duct 3, and a heating device 6 provided in the circulating air duct 3 and configured to heat air. As shown in FIG. 3, the circulating fan 4 drives an airflow to start from the circulating air duct 3, sequentially pass through the air inlet 21, the test chamber 2, and the air return inlet 22, and return to the circulating air duct 3, and the airflow is heated by the heating device 6 in the circulating air duct 3 and is driven by the circulating fan 4 again to circulate, to achieve airflow heating and circulation in the box body 1, so that circulating air carrying heat can make the environment in the test chamber 2 meet test requirements, and the circulating air can dissipate heat for a product, thereby preventing thermal accumulation around the product, and also ensuring uniform test temperatures at different positions in the box body 1.

A fresh air port 31 for external air to enter the circulating air duct 3 and an air outlet 32 for air in the circulating air duct 3 to be discharged outside are opened on a wall of the circulating air duct 3. The air outlet 32 is provided downstream of the air return inlet 22 in an airflow direction, the fresh air port 31 is provided upstream of the circulating fan 4 in the airflow direction, an arrangement position of the fresh air port 31 is between the air outlet 32 and the circulating fan 4. Specifically, the arrangement position is a relative position in the airflow direction when a baffle device 5 is in a first working state (which is described below), and does not specifically indicate a relative position in structure. The baffle device 5 is provided between the fresh air port 31 and the air outlet 32, which is configured to open or shield the fresh air port 31 and the air outlet 32 and configured to open or block the circulating air duct 3 located between the air outlet 32 and the fresh air port 31.

Figure 4:
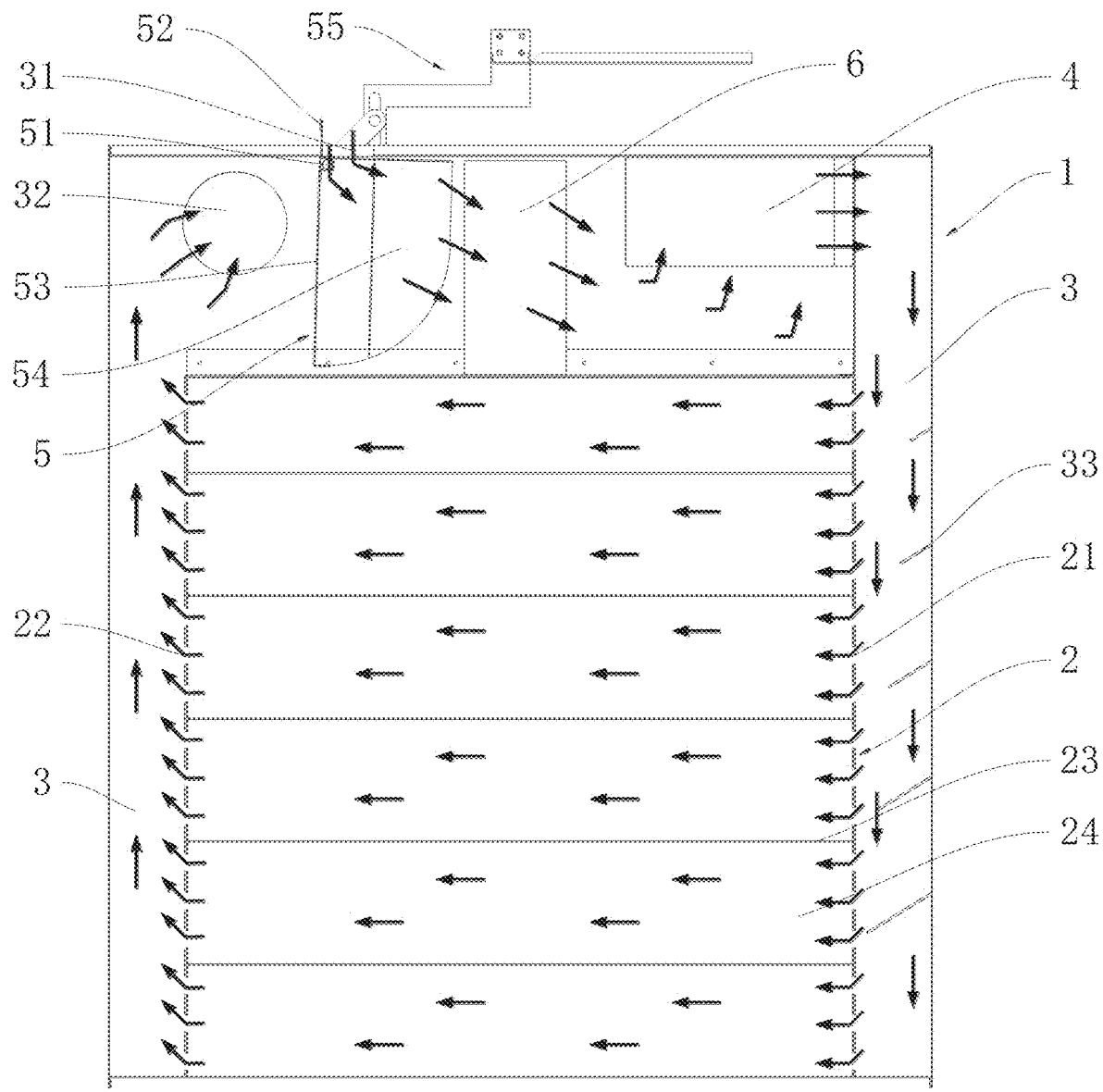
FIG. 4 is an airflow diagram when a baffle device is in a second working state in the embodiment shown in FIG. 1.

The baffle device 5 has at least two working states. When the baffle device 5 is in the first working state, as shown in FIG. 3, the fresh air port 31 and the air outlet 32 are shielded, and the circulating air duct 3 is opened. In this case, the test apparatus is in a normal test process, and the circulating fan 4 drives an airflow in the box to circulate in the test chamber 2 and the circulating air duct 3 and to be heated, thereby simulating a normal test environment, and also ensuring a uniform test temperature in the box. When the baffle device 5 is in a second working state, as shown in FIG. 4, the fresh air port 31 and the air outlet 32 are opened, and the circulating air duct 3 is shielded. In this case, the test apparatus is in a heat dissipation process. Because the circulating air duct 3 between the fresh air port 31 and the air outlet 32 is blocked and the fresh air port 31 is provided upstream of the circulating fan 4, external fresh air is driven by the circulating fan 4 to enter the circulating air duct 3 through the fresh air port 31, enters the test chamber 2 from the circulating air duct 3 through the air inlet 21, and enters the circulating air duct 3 again through the air return inlet 22 corresponding to the air inlet 21, thereby ensuring that the fresh air can uniformly take away heat that accumulates around a product in the test chamber 2. The airflow that enters the circulating air duct 3 again flows to the air outlet 32 along the circulating air duct 3. Because the circulating air duct 3 between the fresh air port 31 and the air outlet 32 is blocked, instead of continuing to circulate, air is discharged from the box body 1 through the air outlet 32. In the present invention, the air outlet 32, the baffle device 5, and the fresh air port 31 are sequentially provided between the air return inlet 22 of the test chamber 2 and the circulating fan 4, and working states are switched via the baffle device 5, so that when the aging test apparatus performs a normal test, circulating air can normally circulate, thereby ensuring a uniform temperature in the test chamber 2. During heat dissipation, external fresh air may be sucked by the circulating fan 4 to smoothly enter the circulating air duct 3, dissipates heat along an existing flow path of circulating air in the box body 1, and can be smoothly discharged outside, so that heat in the box body 1 can be quickly taken away, and it is ensured that temperatures of different products are uniform and consistent, thereby improving the accuracy of test results. In addition, the existing circulating fan 4 of the test apparatus is used to drive fresh air, so that the existing flow path of circulating air in the box is kept from being disturbed by an external device, to ensure smooth air intake and discharge of the fresh air port 31 and the air outlet 32, thereby improving heat dissipation, and further ensure a stable test environment in the box and also reduces energy consumption, thereby reducing test costs.

Figure 5:
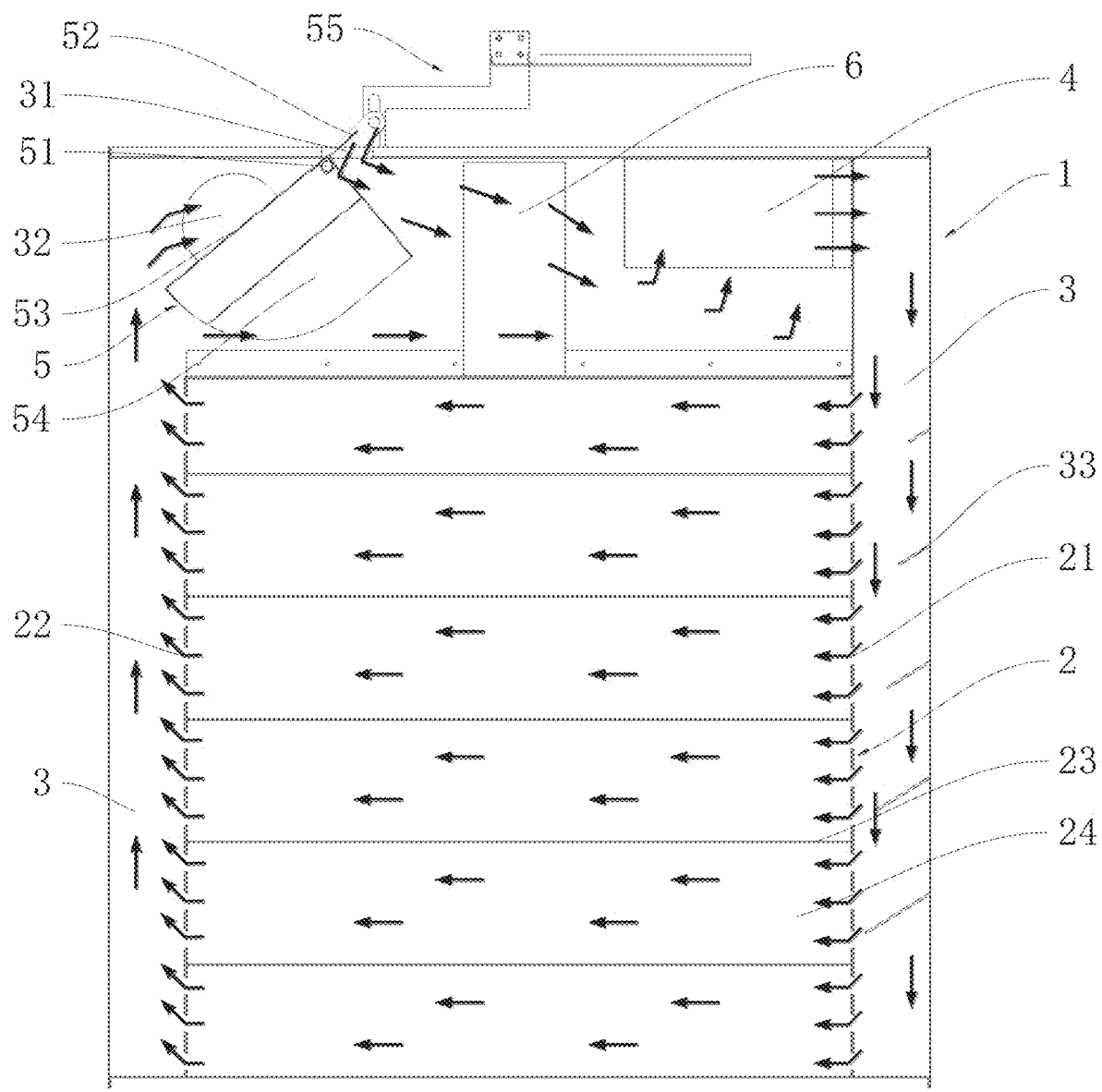
FIG. 5 is an airflow diagram when a baffle device is in a third working state in the embodiment shown in FIG. 1.

In a preferred implementation, the baffle device 5 has at least one third working state between the first working state and the second working state. When the baffle device 5 is in the third working state, as shown in FIG. 5, the fresh air port 31 and the air outlet 32 are partially shielded, and the circulating air duct 3 is partially opened. In this case, the test apparatus is in an adjustable heat dissipation state. Because the fresh air port 31 is partially shielded, a part of external fresh air is sucked into the circulating air duct 3 by the circulating fan 4. In this case, the circulating air duct 3 is partially opened, a part of an airflow that has been circulating in the box body continues to circulate. After flowing into the circulating air duct 3, the external fresh air is mixed with the existing circulating air in the circulating air duct 3, and is driven by the circulating fan 4 to enter the test chamber 2 to dissipate heat for an electronic device. Because the air outlet 32 is also partially shielded, an airflow that enters the circulating air duct 3 again from the test chamber 2 is split when flowing to the air outlet 32. One part is discharged from the box body 1 through the air outlet 32 to complete heat dissipation, and the other part flows through an opening made by the baffle device 5, and is mixed with fresh air that enters subsequently to circulate again. When the baffle device 5 is adjusted, the opening degree of the fresh air port 31 and the opening degree of the air outlet 32 are synchronized and identical, i.e., simultaneously increase or simultaneously decrease. The opening degree of the circulating air duct 3 is synchronized but opposite to the former two, i.e., when the opening degrees of the fresh air port 31 and the air outlet 32 increase, the opening degree of the circulating air duct 3 decreases accordingly, and when the opening degrees of the fresh air port 31 and the air outlet 32 decrease, the opening degree of the circulating air duct 3 increases accordingly. The opening degrees of the fresh air port 31, the air outlet 32, and the circulating air duct 3 are adjusted via the baffle device 5, so that air volumes of air intake and air discharge and a flow splitting ratio of an airflow at the air outlet 32 can be adjusted, making it convenient to flexibly adjust air discharge strength based on actual heat generation of a product under test, thereby improving the use flexibility and universality of the test apparatus.

In a preferred implementation, the baffle device 5 includes a rotating shaft 51 rotatably connected to an inner wall of the circulating air duct 3 in an airflow direction perpendicular to an arrangement position of the baffle device 5, a first baffle 52 fixedly connected to one side of the rotating shaft 51 and configured to open or shield the fresh air port 31, a second baffle 53 fixedly connected to the other side of the rotating shaft 51 and configured to open or block the circulating air duct 3, a third baffle 54 fixedly provided on a lateral side of the second baffle 53 that is close to the inner wall of the circulating air duct 3, perpendicular to the second baffle 53, and configured to open or shield the air outlet 32, and a driving assembly 55 connected to the rotating shaft 51 and configured to drive the rotating shaft 51 to rotate. When the baffle device 5 is in the first working state, the first baffle 52 fully shields the fresh air port 31, the second baffle 53 fully opens the circulating air duct 3, and the third baffle 54 fully shields the air outlet 32. When the baffle device 5 is in the third working state, the first baffle 52 partially shields the fresh air port 31, the second baffle 53 partially blocks the circulating air duct 3, and the third baffle 54 partially shields the air outlet 32. When the baffle device 5 is in the second working state, the first baffle 52 fully opens the fresh air port 31, the second baffle 53 fully blocks the circulating air duct 3, and the third baffle 54 fully opens the air outlet 32. The linkage adjustment of the opening degrees of the fresh air port 31, the air outlet 32, and the circulating air duct 3 can be simply and conveniently achieved via the foregoing structure, so that the structure of the test apparatus is simplified, and the production costs of the test apparatus are also reduced. It should be noted that although the terms "fully shield" and "fully open" are used here, they cannot be limited to the theoretical "fully" due to errors in manufacturing, processing, and installation. That is, "fully shield" should not be limited to "airtight", but should be interpreted as "basically airtight", and "fully open" should not be limited to "zero obstruction to an airflow", but should be interpreted as "basically zero obstruction to an airflow".

In a preferred implementation, the air outlet 32 is provided on a sidewall of the circulating air duct 3 that is perpendicular to the rotating shaft 51, and the fresh air port 31 is provided on a sidewall of the circulating air duct 3 that is parallel to the rotating shaft 51, making it convenient to precisely adjust the opening degrees of the fresh air port 31 and the air outlet 32 via the first baffle 52 and the third baffle 54, especially the air outlet 32, because the proper control of air discharge is significant to heat dissipation.

In a preferred implementation, the driving assembly 55 includes a rocker arm 551 with one end fixedly connected to an end portion of the rotating shaft 51 and an actuating member 552 slidably connected to the box body 1 in a parallel direction, a sliding groove 553 perpendicular to an axial direction of the rotating shaft 51 is opened at an end portion of the actuating member 552 close to the rocker arm 551, a slider 554 is provided at the other end of the rocker arm 551, and the slider 554 is connected in the sliding groove 553 in both a relatively rotatable manner and a relatively slidable manner, so that the rotation angles of the first baffle 52, the second baffle 53, and the third baffle 54 can be simply and conveniently adjusted by sliding the actuating member 552.

In a preferred implementation, the test circuit unit includes a plurality of carrier boards 23 arranged vertically and configured to load electronic devices, the plurality of carrier boards 23 divide the test chamber 2 into a plurality of test layers 24, and one set of the air inlet 21 and the air return inlet 22 are provided on each of the test layers 24, so that it can be ensured that fresh air passes around every product while improving the test efficiency.

In a preferred implementation, the air inlet 21 and the air return inlet 22 of each test layer 24 are respectively provided on two opposite sidewalls of the test layer 24, thereby ensuring that the flow direction of fresh air is stable, and preventing nonuniform heat dissipation due to turbulence.

In a preferred implementation, a flow deflector 33 corresponding to the air inlet 21 in both quantity and position and configured to guide an airflow to the corresponding air inlet 21 is provided on an inner wall in the circulating air duct 3 that is opposite to the air inlet 21, each flow deflector 33 is provided inclined from upstream to downstream of the airflow direction from a side of the flow deflector 33 that is connected to the inner wall of the circulating air duct 3 to a side thereof close to the air inlet 21, so that fresh air can be fed into every test layer 24.

In a preferred implementation, a length of each flow deflector 33 located downstream of the airflow direction is greater than a length of the flow deflector 33 located upstream of the airflow direction, to ensure the same air volume for each test layer 24, thereby further ensuring uniform heat dissipation in the box body 1.

In a preferred implementation, the heating device 6 is located between the fresh air port 31 and the circulating fan 4, making it convenient to heat fresh air to some extent according to a test requirement to adjust the temperature of the fresh air.

Due to the use of the foregoing technical solutions, the present invention has the following advantages over the related art.

The electronic device aging test apparatus of the present invention my cut off existing circulating air in the box body and enables external fresh air to dissipate heat along the flow path of the existing circulating air, so that heat in the box body can be quickly taken away, and it is ensured that temperatures of different products are uniform and consistent, thereby improving the accuracy of test results. In addition, the existing circulating fan of the test apparatus is used to drive fresh air, so that the existing flow path of circulating air in the box body is kept from being disturbed by an external device, to ensure smooth air intake and discharge of the fresh air port and the air outlet, thereby improving heat dissipation, and further ensure a stable test environment in the box and also reduces energy consumption, thereby reducing test costs.

The foregoing embodiments are only used to describe the technical concept and characteristics of the present invention, and are intended to enable a person skilled in the art to understand the content of the present invention and achieve implementation, but shall not be used to limit the protection scope of the present invention. Any equivalent variations or modifications made according to the spirit and essence of the present invention shall fall within the protection scope of the present invention.

What is claimed is:

1. An electronic device aging test apparatus, comprising a box body (1), a test chamber (2) provided in the box body (1) and provided with at least one set of an air inlet (21) and an air return inlet (22), a test circuit unit provided in the test chamber (2) and configured to connect to an electronic device under test, an electric cabinet adjacent to the test chamber (2) and connected to the test circuit unit to supply power, a circulating air duct (3) provided on a periphery of the test chamber (2) and having two ends in fluid communication with the air inlet (21) and the air return inlet (22) respectively, a circulating fan (4) provided in the circulating air duct (3), and a heating device (6) provided in the circulating air duct (3), wherein the circulating fan (4) drives an airflow to start from the circulating air duct (3), sequentially pass through the air inlet (21), the test chamber (2), and the air return inlet (22), and return to the circulating air duct (3), a fresh air port (31) for external air to enter the circulating air duct (3) and an air outlet (32) for air in the circulating air duct (3) to be discharged outside are opened on a wall of the circulating air duct (3), the air outlet (32) is provided downstream of the air return inlet (22) in an airflow direction, the fresh air port (31) is provided upstream of the circulating fan (4) in the airflow direction, an arrangement position of the fresh air port (31) is between the air outlet (32) and the circulating fan (4), a baffle device (5) is provided between the fresh air port (31) and the air outlet (32), which is configured to open or shield the fresh air port (31) and the air outlet (32) and configured to open or block the circulating air duct (3) located between the air outlet (32) and the fresh air port (31), and the baffle device (5) comprises a rotating shaft (51) rotatably connected to an inner wall of the circulating air duct (3) in an airflow direction perpendicular to an arrangement position of the baffle device (5), a first baffle (52) fixedly connected to one side of the rotating shaft (51) and configured to open or shield the fresh air port (31), a second baffle (53) fixedly connected to the other side of the rotating shaft (51) and configured to open or block the circulating air duct (3), a third baffle (54) fixedly provided on a lateral side of the second baffle (53) that is close to an inner wall of the circulating air duct (3), perpendicular to the second baffle (53), and configured to open or shield the air outlet (32), and a driving assembly (55) connected to the rotating shaft (51) and configured to drive the rotating shaft (51) to rotate; the baffle device (5) has a first working state, a second working state, and at least one third working state between the first working state and the second working state; when the baffle device (5) is in the first working state, the first baffle (52) fully shields the fresh air port (31), the second baffle (53) fully opens the circulating air duct (3), and the third baffle (54) fully shields the air outlet (32); when the baffle device (5) is in the second working state, the first baffle (52) fully opens the fresh air port (31), the second baffle (53) fully blocks the circulating air duct (3), and the third baffle (54) fully opens the air outlet (32); and when the baffle device (5) is in the third working state, the first baffle (52) partially shields the fresh air port (31), the second baffle (53) partially blocks the circulating air duct (3), and the third baffle (54) partially shields the air outlet (32).

2. The electronic device aging test apparatus according to claim 1, wherein the air outlet (32) is provided on a sidewall of the circulating air duct (3) that is perpendicular to the rotating shaft (51), and the fresh air port (31) is provided on a sidewall of the circulating air duct (3) that is parallel to the rotating shaft (51).

3. The electronic device aging test apparatus according to claim 1, wherein the driving assembly (55) comprises a rocker arm (551) with one end fixedly connected to an end portion of the rotating shaft (51) and an actuating member (552) slidably connected on the box body (1) in a parallel direction, a sliding groove (553) perpendicular to an axial direction of the rotating shaft (51) is opened on an end portion of the actuating member (552) close to the rocker arm (551), a slider (554) is provided at the other end of the rocker arm (551), and the slider (554) is connected in the sliding groove (553) in both a relatively rotatable manner and a relatively slidable manner.

4. The electronic device aging test apparatus according to claim 1, wherein the test circuit unit comprises a plurality of carrier boards (23) arranged vertically and configured to load electronic devices, the plurality of carrier boards (23) divide the test chamber (2) into a plurality of test layers (24), and each of the test layers (24) is provided with one set of the air inlet (21) and the air return inlet (22).

5. The electronic device aging test apparatus according to claim 4, wherein the air inlet (21) and the air return inlet (22) in each test layer (24) are respectively provided on two opposite sidewalls of the test layer (24).

6. The electronic device aging test apparatus according to claim 1, wherein a flow deflector (33) corresponding to the air inlet (21) in both quantity and position and configured to guide an airflow to the corresponding air inlet (21) is provided on an inner wall of the circulating air duct (3) that is opposite to the air inlet (21), each flow deflector (33) is provided inclined from upstream to downstream of the airflow direction from a side of the flow deflector (33) that is connected to the inner wall of the circulating air duct (3) to a side thereof close to the air inlet (21).

7. The electronic device aging test apparatus according to claim 6, wherein a length of each flow deflector (33) located downstream of the airflow direction is greater than a length of the flow deflector (33) located upstream of the airflow direction.

8. The electronic device aging test apparatus according to claim 1, wherein the heating device (6) is located between the fresh air port (31) and the circulating fan (4).

* * * * *